US010930653B2

(12) United States Patent
Derner et al.

(10) Patent No.: US 10,930,653 B2
(45) Date of Patent: Feb. 23, 2021

(54) APPARATUSES COMPRISING MEMORY CELLS, AND APPARATUSES COMPRISING MEMORY ARRAYS

(71) Applicant: Micron Technology, Inc., Boise, ID (US)

(72) Inventors: Scott J. Derner, Boise, ID (US); Michael Amiel Shore, Boise, ID (US); Charles L. Ingalls, Meridian, ID (US); Steve V. Cole, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/418,150

(22) Filed: May 21, 2019

(65) Prior Publication Data

US 2019/0279984 A1 Sep. 12, 2019

Related U.S. Application Data

(63) Continuation of application No. 15/986,628, filed on May 22, 2018, now Pat. No. 10,347,635.
(Continued)

(51) Int. Cl.
*H01L 27/10* (2006.01)
*H01L 27/108* (2006.01)
(Continued)

(52) U.S. Cl.
CPC ............ *H01L 27/108* (2013.01); *G11C 5/025* (2013.01); *G11C 11/403* (2013.01);
(Continued)

(58) Field of Classification Search
CPC ... H01L 27/108; H01L 28/90; H01L 29/0847; H01L 28/86; G11C 5/025; G11C 11/403;
(Continued)

(56) References Cited

U.S. PATENT DOCUMENTS 5,978,250 A 11/1999 Chung
6,432,769 B1 * 8/2002 Fukuda ............. H01L 27/10808
438/244
(Continued)

FOREIGN PATENT DOCUMENTS

WO WO02/052572 A1 7/2002

*Primary Examiner* — Matthew L Reames
(74) *Attorney, Agent, or Firm* — Wells St. John P.S.

(57) ABSTRACT

Some embodiments include an apparatus having memory cells which include capacitors. Bitline pairs couple with each of the memory cells. One of the bitlines within each bitline pair corresponds to a first comparative bitline and the other of the bitlines within each bitline pair corresponds to a second comparative bitline. The bitline pairs extend to sense amplifiers which compare electrical properties of the first and second comparative bitlines to one another. The memory cells are subdivided amongst a first memory cell set using a first set of bitline pairs and a first set of sense amplifiers, and a second memory cell set using a second set of bitline pairs and a second set of sense amplifiers. The second set of bitline pairs has the same bitlines as the first set of bitline pairs, but in a different pairing arrangement as compared to the first set of bitline pairs.

19 Claims, 8 Drawing Sheets

Related U.S. Application Data

(60) Provisional application No. 62/527,564, filed on Jun. 30, 2017.

(51) Int. Cl.
| | |
|---|---|
| *G11C 11/408* | (2006.01) |
| *H01L 49/02* | (2006.01) |
| *G11C 11/4097* | (2006.01) |
| *H01L 29/08* | (2006.01) |
| *G11C 11/4094* | (2006.01) |
| *G11C 5/02* | (2006.01) |
| *G11C 11/403* | (2006.01) |
| *G11C 11/4091* | (2006.01) |

(52) U.S. Cl.
CPC ...... *G11C 11/4085* (2013.01); *G11C 11/4094* (2013.01); *G11C 11/4097* (2013.01); *H01L 28/90* (2013.01); *H01L 29/0847* (2013.01); *G11C 11/4091* (2013.01); *H01L 28/86* (2013.01)

(58) Field of Classification Search
CPC ............ G11C 11/4085; G11C 11/4097; G11C 11/4094; G11C 11/4091
See application file for complete search history.

(56) References Cited

U.S. PATENT DOCUMENTS

| | | |
|---|---|---|
| 7,897,460 B2 | 3/2011 | Parekh |
| 2008/0253160 A1 | 10/2008 | Popp |
| 2018/0061835 A1 | 3/2018 | Yang |

* cited by examiner

APPARATUSES COMPRISING MEMORY CELLS, AND APPARATUSES COMPRISING MEMORY ARRAYS

RELATED PATENT DATA

This application is a continuation of U.S. patent application Ser. No. 15/986,628, filed May 22, 2018, which claims benefit of U.S. Provisional Patent Application Ser. No. 62/527,564, filed Jun. 30, 2017, the disclosures of which are hereby incorporated herein by reference.

TECHNICAL FIELD

Apparatuses comprising memory cells, and apparatuses comprising memory arrays.

BACKGROUND

Dynamic Random Access Memory (DRAM) is utilized in modern computing architectures. DRAM may provide advantages of structural simplicity, high speed and low cost in comparison to alternative types of memory.

DRAM commonly utilizes memory cells having one capacitor in combination with a transistor (so-called 1T-1C memory cells), with the capacitor being coupled with a source/drain region of the transistor. One of the limitations to scalability of present 1T-1C configurations is that it is proving difficult to incorporate capacitors having sufficiently high capacitance into highly-integrated architectures.

Figure 1:
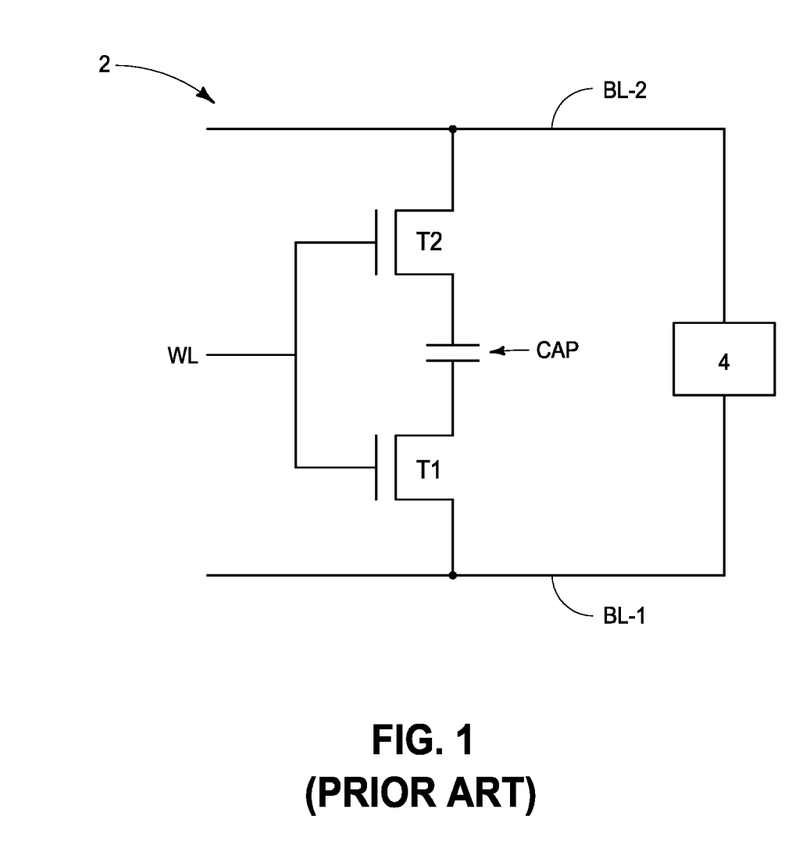
FIG. 1 is a schematic diagram of a prior art memory cell having 2 transistors and 1 capacitor.

As another DRAM cell, a 2T-1C memory cell configuration is schematically illustrated in FIG. 1 according to the prior art. The 2T-1C memory cell includes two transistors and one capacitor; with the two transistors of the FIG. 1 configuration being labeled as T1 and T2, and with the capacitor being labeled as CAP.

A source/drain region of T1 connects with a first node of the capacitor (CAP), and the other source/drain region of T1 connects with a first comparative bitline (BL-1). A gate of T1 connects with a wordline (WL). A source/drain region of T2 connects with a second node of the capacitor (CAP), and the other source/drain region of T2 connects with a second comparative bitline BL-2. A gate of T2 connects with the wordline (WL).

The comparative bitlines BL-1 and BL-2 extend to circuitry 4 (e.g., a sense amplifier) which compares electrical properties (e.g., voltage) of the two to ascertain a memory state of memory cell 2.

The 2T-1C configuration of FIG. 1 may be utilized in DRAM and/or other types of memory. The 2T-1C configuration may be advantageous relative to the 1T-1C configuration, in that the 2T-1C configuration may provide improved signal-to-noise, reduced leakage, lower power operation, lower voltage operation, etc.

In some applications, it would be desirable to develop memory array architecture designed to incorporate 2T-1C configurations instead of conventional 1T-1C configurations.

DETAILED DESCRIPTION OF THE ILLUSTRATED EMBODIMENTS

Some embodiments include memory arrays having 2T-1C memory cells. The memory arrays may have configurations which are suitable for relatively quick adoption in that they may utilize structures already present in existing DRAM structures configured for utilization of 1T-1C memory cells. Accordingly, the benefits of 2T-1C technology (e.g., improved signal-to-noise, reduced leakage, lower power operation, lower voltage operation, etc.) may be realized without substantial modification of established fabrication processes currently utilized for producing DRAM structures based on 1T-1C technology. Although some of the applications and structures described herein were developed for utilization with 2T-1C memory cells, it is recognized that various aspects of this disclosure may have utility relative to other memory cells besides 2T-1C memory cells. Accordingly, the various embodiments described herein are not to be limited to 2T-1C memory cells, except to the extent, if any, that 2T-1C memory cells are expressly recited in the claims that follow. Specific example embodiments are described below with reference to FIGS. 2-7.

Figure 2:
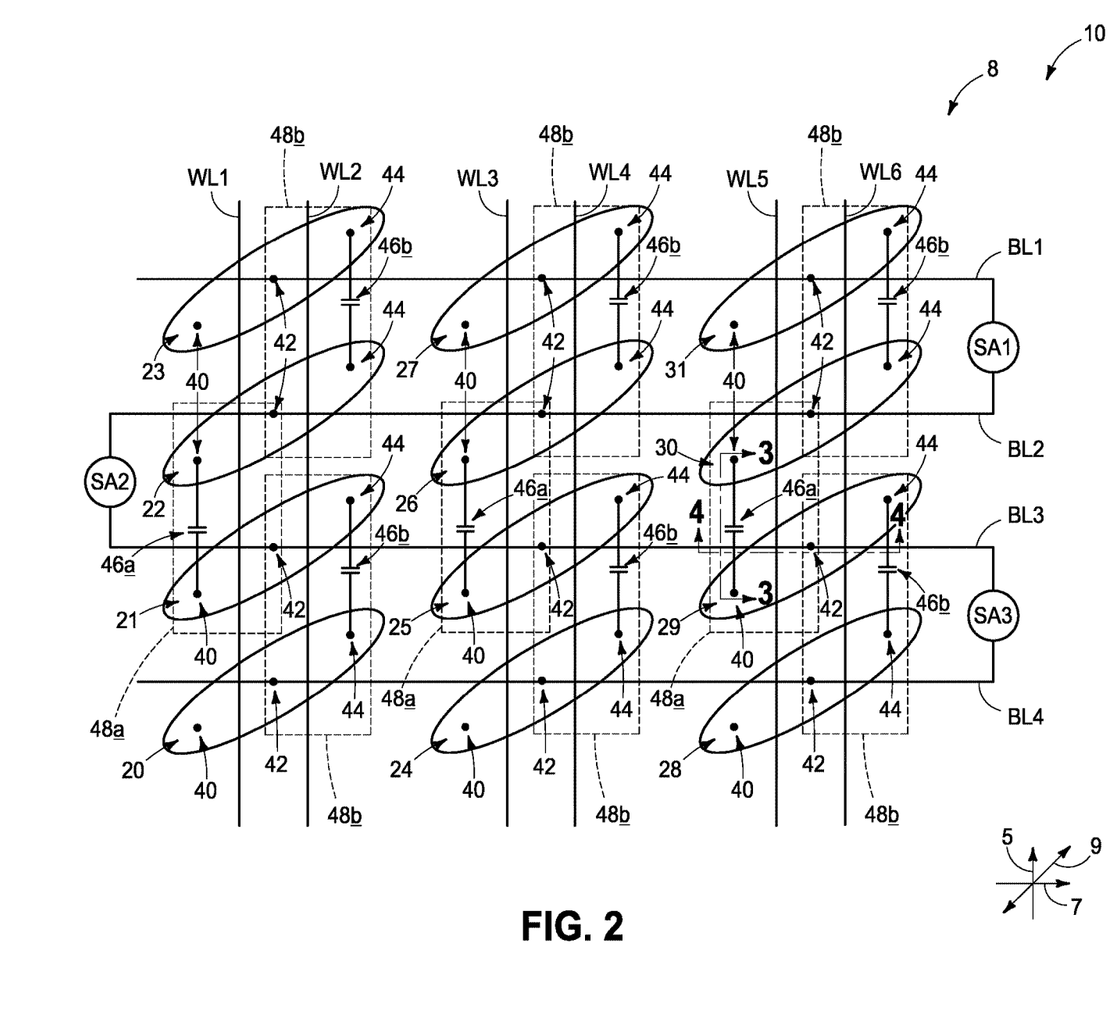
FIG. 2 is a diagrammatic top view of a region of a memory array showing an example configuration for memory cells having 2 transistors and 1 capacitor.
Figure 3:
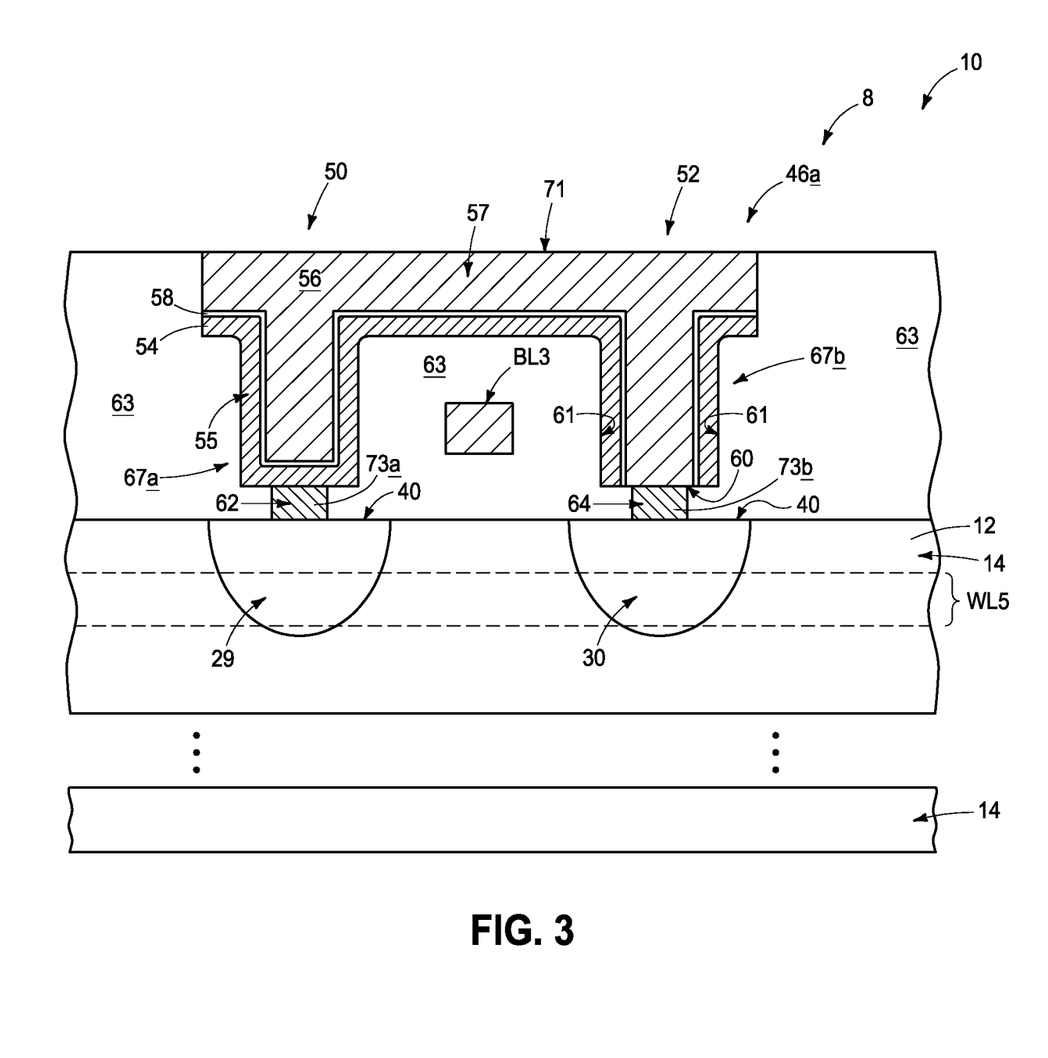
FIGS. 3 and 4 are diagrammatic cross-sectional side views of regions of the memory array of FIG. 2; with the cross-section of FIG. 3 being along the line 3-3 of FIG. 2, and with the cross-section of FIG. 4 being along the line 4-4 of FIG. 2.
Figure 4:
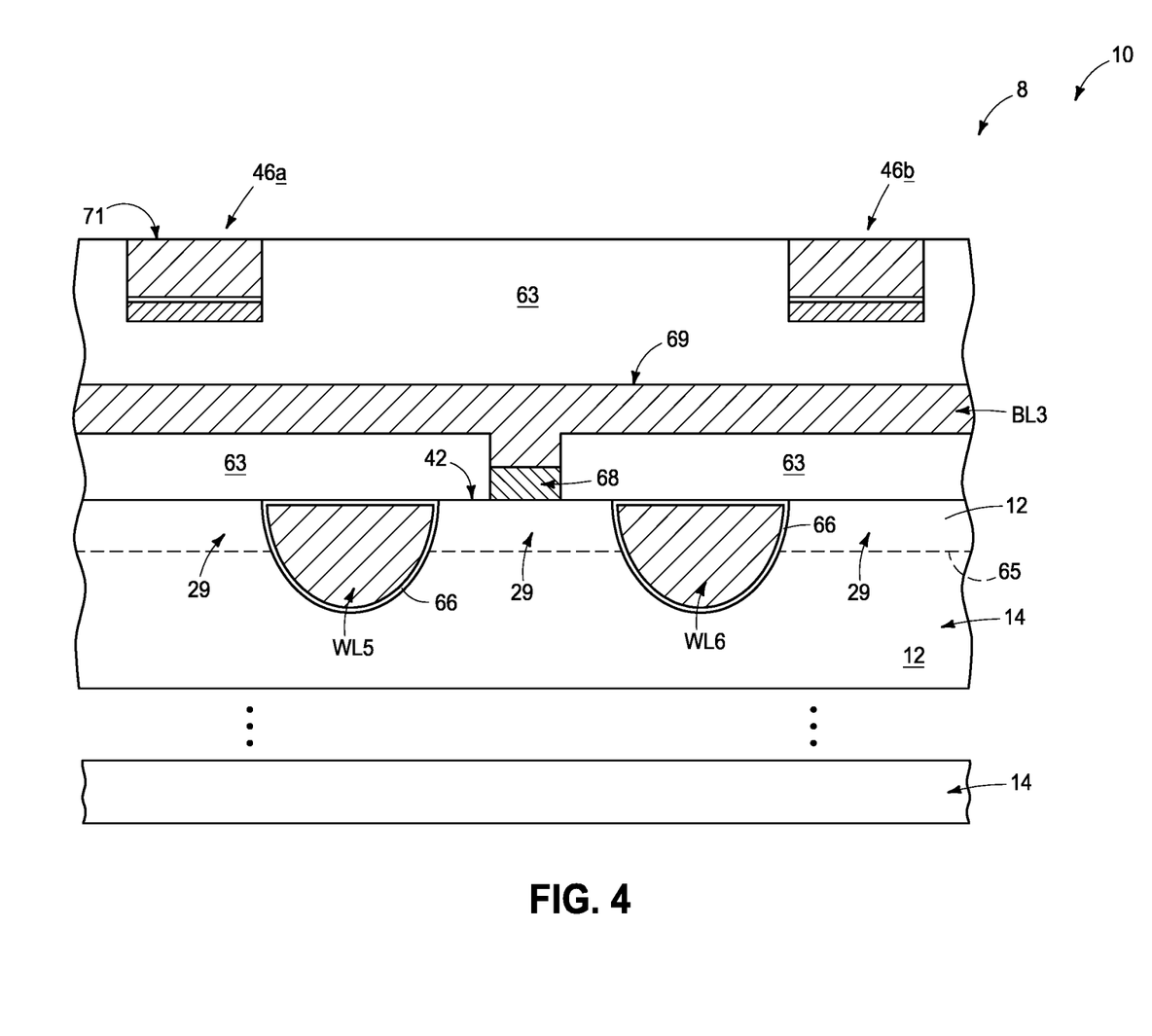

FIGS. 2-4 diagrammatically illustrate regions of an assembly 10 comprising a memory array 8 in accordance with a first embodiment. Referring to FIG. 2, a plurality of wordlines (WL1, WL2, WL3, WL4, WL5, WL6) extend across the memory array, and a plurality of bitlines (BL1, BL2, BL3, BL4) also extend across the memory array. The wordlines (WL1, WL2, WL3, WL4, WL5, WL6) extend along a first direction of an axis 5, and the bitlines (BL1, BL2, BL3, BL4) extend along a second direction of an axis 7, with the second direction crossing the first direction. In some embodiments, the wordlines (WL1, WL2, WL3, WL4, WL5, WL6) may extend substantially orthogonally relative to the bitlines (BL1, BL2, BL3, BL4); or in other words the direction of the axis 5 may be substantially orthogonal relative to the direction of the axis 7. The term "substantially orthogonal" means orthogonal relative to within reasonable tolerances of fabrication and measurement. In some embodiments, the wordlines (WL1, WL2, WL3, WL4, WL5, WL6) may cross the bitlines (BL1, BL2, BL3, BL4) and may extend along a direction which is not substantially orthogonal to the direction of the bitlines; or in other words, the direction of the axis 5 may intersect the direction of the axis 7 without being substantially orthogonal to the direction of the axis 7. In some embodiments, the wordlines (WL1, WL2, WL3, WL4, WL5, WL6) may be considered to extend along rows of the memory array 8, and the bitlines (BL1, BL2, BL3, BL4) may be considered to extend along columns of the memory array.

The wordlines (WL1, WL2, WL3, WL4, WL5, WL6) and bitlines (BL1, BL2, BL3, BL4) are shown to be straight lines in the diagrammatic illustration of FIG. 2, and in some embodiments the wordlines (WL1, WL2, WL3, WL4, WL5, WL6) and bitlines (BL1, BL2, BL3, BL4) may be substantially straight (with the term "substantially straight" meaning straight to within reasonable tolerances of fabrication and measurement). In other embodiments, the wordlines (WL1, WL2, WL3, WL4, WL5, WL6) and/or the bitlines (BL1, BL2, BL3, BL4) may be curved, wavy, or any other suitable configurations.

Although the term "wordline" is utilized herein, it is to be understood that such term is generic relative to other terms that may be utilized to describe identical structures, such as, for example, the term "access line". Also, although the term "bitline" is utilized herein, it is to be understood that such term is generic relative to other terms that may be utilized to describe identical structures, such as, for example, the term "sense line" and the term "digit line".

Active regions 20-31 are shown proximate the wordlines (WL1, WL2, WL3, WL4, WL5, WL6). The active regions may include regions of conductively-doped semiconductor material adjacent the wordlines, as described in more detail below with reference to FIGS. 3 and 4. For instance, regions of the wordlines (WL1, WL2, WL3, WL4, WL5, WL6) crossing the active regions 20-31 may comprise transistor gates, and the active regions 20-31 may include source/drain regions which are gatedly coupled to one another through such transistor gates.

The active regions 20-31 are illustrated as islands in the example arrangement of FIG. 2, but may have any suitable configuration. For instance, in some embodiments the active regions 20-31 may be formed by providing dopant in stripes extending along a direction of an axis 9. Trenched isolation material may be provided as lines extending parallel to the wordlines (WL1, WL2, WL3, WL4, WL5, WL6) to segment the stripes into regions analogous to the illustrated active regions 20-31.

The wordlines (WL1, WL2, WL3, WL4, WL5, WL6) may be considered to be in paired arrangements of parallel wordlines, with the wordline pairs extending through common active regions. For instance, wordlines WL1 and WL2 are paired and extend through active regions 20-23, wordlines WL3 and WL4 are paired and extend through active regions 24-27, and wordlines WL5 and WL6 are paired and extend through active regions 28-31. The paired wordlines may be considered to be a first wordline and a second wordline. For instance, the paired wordlines WL3 and WL4 may be referred to as a first wordline and a second wordline, respectively, in the discussion that follows.

Each of the active regions 20-31 has a first capacitor-contact region 40, a second capacitor-contact region 44, and a bitline-contact region 42 between the first and second capacitor-contact regions 40 and 44. The bitline-contact regions 42 are between the paired first and second wordlines (for instance, between the first wordline WL3 and the second wordline WL4); the first capacitor-contact regions 40 are on an opposing side of the first wordlines from the bitline-contact regions 42 (for instance, on an opposing side of the first wordline WL3 from the bitline-contact regions); and the second capacitor-contact regions 44 are on an opposing side of the second wordlines from the bitline-contact regions 42 (for instance, on an opposing side of the second wordline WL4 from the bitline-contact regions).

Capacitors 46 extend over the active regions 20-31. Each capacitor has a first electrode and a second electrode (as described in more detail below with reference to FIG. 3). Each capacitor has its first electrode coupled to a different active region than its second electrode; with the capacitors extending between capacitor-contact regions (40, 44) of adjacent active regions. Some of the capacitors 46 extend between the first capacitor-contact regions 40 of the adjacent active regions, and others of the capacitors 46 extend between second capacitor-contact regions 44 of the adjacent active regions. The capacitors which extend between first capacitor-contact regions 40 are identified as capacitors of a first capacitor set and labeled 46a, while the capacitors which extend between second capacitor-contact regions are identified as capacitors of a second capacitor set and labeled 46b. The capacitors of the first and second capacitor sets are identical to one another, and the labels 46a and 46b are utilized simply to distinguish capacitors of the first capacitor set from capacitors of the second capacitor set. In the shown embodiment, the capacitors 46a of the first capacitor set are along a first side of the wordlines (specifically, the left side of the wordlines in the view of FIG. 2), and the capacitors 46b of the second capacitor set are along a second side of the wordlines in opposing relation to the first side (specifically, the right side of the wordlines in the view of FIG. 2).

Each of the capacitors 46 is comprised by a memory cell 48, with the memory cells being in one-to-one correspondence with the capacitors. The memory cells which include capacitors 46a of the first capacitor set are labeled as 48a and may be considered to be memory cells of a first memory cell set; and the memory cells which include capacitors 46b of the second capacitor set are labeled as 48b and may be considered to be memory cells of a second memory cell set. The memory cells of the first and second memory cell sets are identical to one another, and the labels 48a and 48b are utilized simply to distinguish memory cells of the first memory cell set from memory cells of the second memory cell set.

The bitlines (BL1, BL2, BL3, BL4) may be considered to be in paired arrangements; with one of the bitlines within each pair corresponding to a first comparative bitline, and the other of the bitlines within each pair corresponding to a second comparative bitline. The bitline pairs extend to sense amplifiers (SA1, SA2, SA3), which compare electrical properties of the first and second comparative bitlines to one another. Each of the memory cells 48 is uniquely addressed utilizing one of the wordlines (WL1, WL2, WL3, WL4, WL5, WL6), and one of the bitline pairs (i.e., each memory cell is coupled with a wordline and a bitline pair). The memory cells 48a are addressed utilizing paired bitlines BL2/BL3, and the sense amplifier SA2. In contrast, the memory cells 48b are addressed utilizing either the paired bitlines BL1/BL2 with a sense amplifier SA1, or the paired bitlines BL3/BL4 with sense amplifier SA3. Notably, the memory cells 48a of the first memory cell set are addressed utilizing the same bitlines as are utilized for addressing the memory cells 48b of the second memory cell set. However, the bitlines are utilized in different pairing arrangements for addressing memory cells 48a of the first memory cell set than for addressing memory cells 48b of the second memory cell set.

In the shown embodiment, the sense amplifiers utilized for addressing memory cells 48a of the first memory cell set (e.g., SA2) are on an opposite side of the memory array 8 than the sense amplifiers utilized for addressing memory cells 48b of the second memory cell set (e.g., SA1, SA3). The sense amplifier SA2 may be considered to be representative of a first set of sense amplifiers utilized for addressing the memory cells 48a of the first memory cell set, and the sense amplifiers SA1 and SA3 may be considered to be representative of a second set of sense amplifiers utilized for addressing the memory cells 48b of the second memory cell set. In some contexts, it may be desirable to express the illustrated arrangement of the sense amplifiers of the first set (e.g., SA2) and the second set (e.g. SA1, SA3) relative to an orientation of the wordlines (WL1, WL2, WL3, WL4, WL5, WL6). For instance, the bitline-contact regions 42 may be considered to be laterally inward of the first and second wordlines (e.g., laterally inward between a first wordline WL3 and a second wordline WL4). The sense amplifiers of the first set (e.g., SA2) may be considered to be laterally outward one of the first and second wordlines (e.g., WL3), and the sense amplifiers of the second set (e.g. SA1, SA3) may be considered to be laterally outward of the other of the first and second wordlines (e.g., WL4).

Figure 5:
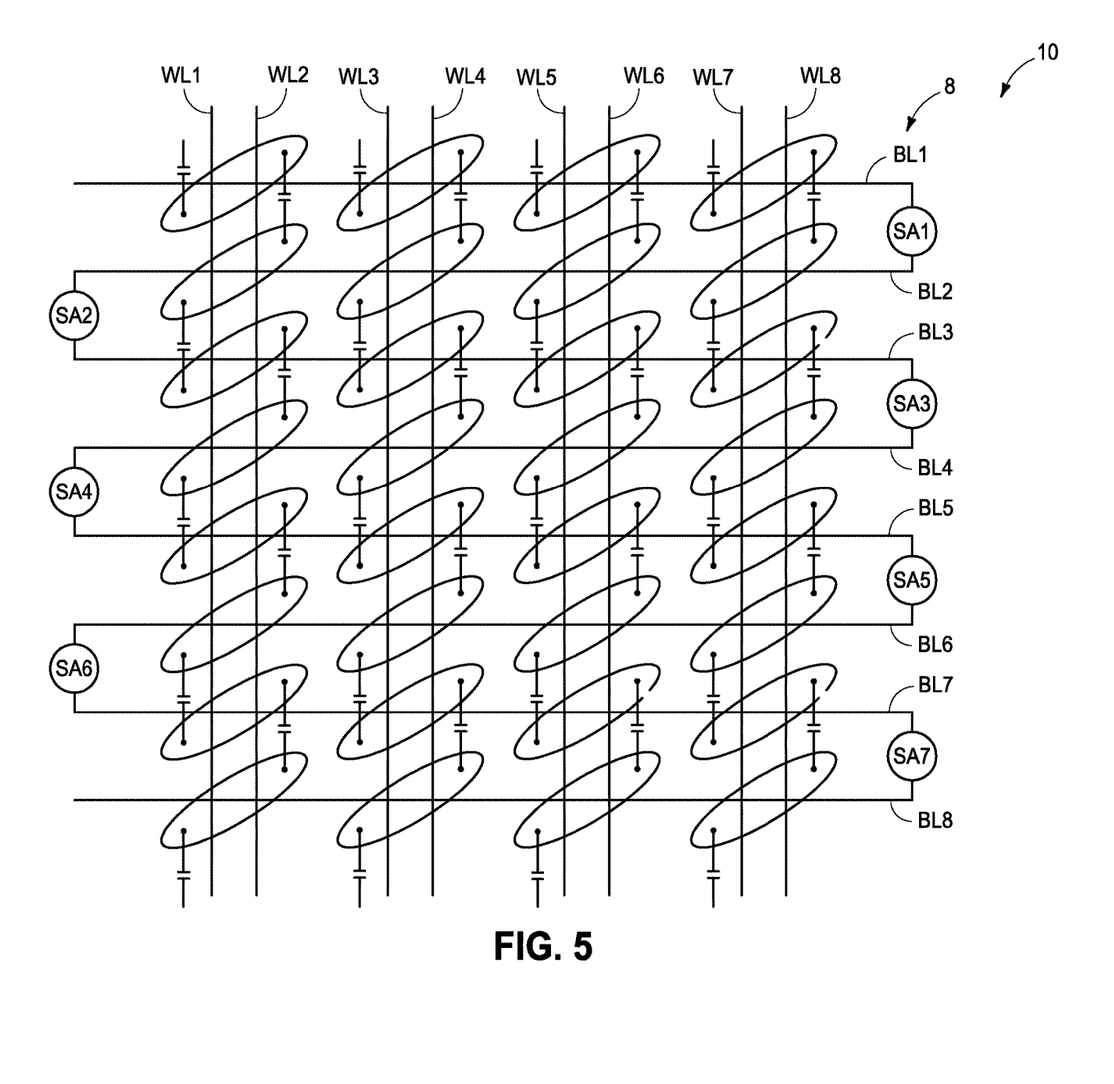
FIG. 5 is a diagrammatic top view showing a larger portion of the memory array of FIG. 2 than is shown in FIG. 2.

FIG. 5 shows an expanded region of the memory array 8 to more fully illustrate that the sense amplifier SA2 may be part of a set comprising multiple sense amplifiers along one side of the memory array, while the sense amplifiers SA1 and SA2 are part of another set comprising multiple sense amplifiers along an opposing side of the memory array. The illustrated region of FIG. 5 comprises wordlines (WL1, WL2, WL3, WL4, WL5, WL6, WL7, WL8) and bitlines (BL1, BL2, BL3, BL4, BL5, BL6, BL7, BL8). Other structures of FIG. 5 are not labeled, but are analogous to the similar structures shown in FIG. 2.

The capacitors 46, wordlines (WL1, WL2, WL3, WL4, WL5, WL6) and bitlines (BL1, BL2, BL3, BL4) of FIG. 2 may have any suitable configuration and structural relation relative to one another. FIGS. 3 and 4 are cross-sectional views through portions of the example memory array 8 of FIG. 2 showing example structural relationships of some of the example structures.

Referring to FIG. 3, an example capacitor 46a is shown to comprise a conductive first material 54 configured as a first electrode 55, a conductive second material 56 configured as a second electrode 57, and a dielectric material 58 between the first and second conductive materials 54 and 56. The conductive materials 54 and 56 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 54 and 56 may be a same composition as one another in some embodiments, or may be different compositions relative to one another.

The dielectric material 58 may comprise any suitable composition or combination of compositions; and in some embodiments may comprise one or more of silicon dioxide, silicon nitride, etc.

The active regions 29 and 30 are shown comprising conductively-doped regions extending into a semiconductor material 12. The semiconductor material 12 may, for example, comprise, consist essentially of, or consist of monocrystalline silicon. The semiconductor material 12 may be considered to be comprised by a semiconductor substrate 14. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials).

The terms "substrate" and "base" refer to any supporting structure, including, but not limited to, the semiconductor substrates described above. In some applications, the semiconductor substrate 14 may include one or more materials and/or components associated with integrated circuit fabrication. A gap is provided within the substrate 14 to indicate that there may be other structures or components beneath the illustrated upper portion of the substrate 14 and a lower portion of the substrate 14. In some embodiments, the lower portion of the substrate 14 may comprise, consist essentially of, or consist of the semiconductor material 12. In some embodiments, the illustrated upper portion of the substrate 14 may be directly against the illustrated lower portion of the substrate 14 (i.e., there may be no gap).

The wordline WL5 is diagrammatically illustrated in the cross-section of FIG. 3, and is shown in dashed-line view to indicate that such wordline is behind the plane of the cross-section of FIG. 3.

The capacitor 46a has a first region 50 over the active region 29, and has a second region 52 over the active region 30 and laterally adjacent to the first region 50. In the shown embodiment, the first region 50 includes a container-shaped portion of the first electrode 55. The dielectric material 58 and the second electrode 57 extend into such container-shaped portion of the first electrode. The first electrode 54 has an opening 60 extending therethrough in the second region 52, and the second electrode 57 extends through the opening 60. A conductive contact 62 is provided to form electrical connection between the first capacitor electrode 55 and the capacitor-contact region 40 of the active region 29, and a conductive contact 64 is provided to form electrical connection between the second capacitor electrode 57 and the capacitor-contact region 40 of the active region 30. The conductive contacts 62 and 64 may comprise any suitable compositions or combinations of compositions; including, for example, one or more of various metals, metal-containing materials (e.g., metal silicide, metal nitride, etc.) and conductively-doped semiconductor materials. In some embodiments, one or both of the conductive contacts 62 and 64 may be omitted, and one or both of the electrodes 55 and 57 may be formed in direct contact with an underlying active region (29, 30).

An insulative material 63 is provided over semiconductor material 12 and around the capacitor 46a. Such insulative material may comprise any suitable composition or combination of compositions; including, for example, one or more of silicon dioxide, silicon nitride, etc.

Referring to FIG. 4, the bitline BL3 is shown making electrical contact to a bitline-contact region 42 of active region 29. The paired wordlines WL5 and WL6 are shown extending through the active region 29, and the bitline-contact region 42 is shown being between such paired wordlines.

In the shown embodiment, the wordlines WL5 and WL6 are recessed into semiconductor material 12 of the semiconductor substrate 14. The wordlines WL5 and WL6 are surrounded by dielectric material 66. The dielectric material 66 along the sides and bottoms of the wordlines corresponds to gate dielectric. The dielectric material 66 over the wordlines is insulative capping material. In some embodiments, the gate dielectric and the insulative capping material may be a same composition as one another, and in other embodiments may be different compositions relative to one another. The dielectric material 66 may comprise any suitable composition or combination of compositions; and in some embodiments may comprise, consist essentially of, or consist of one or more of silicon dioxide, silicon nitride, etc.

The wordlines WL5 and WL6 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

A dashed line 65 is provided to illustrate approximate lower boundaries of conductively doped regions comprised by active region 29. The conductively-doped regions may be n-type doped or p-type doped, depending on the application.

The bitline BL3 may comprise any suitable electrically conductive material, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

In the shown embodiment, the bitline BL3 is electrically coupled with active region 29 through a conductive contact 68. Such conductive contact may comprise any suitable composition or combination of compositions; and in some embodiments may comprise one or more of metal silicide, metal nitride, conductively-doped semiconductor material, etc. In some embodiments, the conductive contact 68 may be omitted, and the bitline BL3 may directly contact an upper surface of the active region 29.

The bitline BL3 may be provided in any suitable orientation relative to the wordlines WL5 and WL6, and relative to the capacitors 46a and 46b. For instance, in the illustrated embodiment the bitline BL3 is over the wordlines WL5 and WL6. Also, in the shown embodiment the bitline BL3 has an upper surface 69 which is below upper surfaces 71 of the capacitors 46a and 46b. In other embodiments, the bitline may be provided over the upper surfaces 71 of the capacitors 46a and 46b.

In some embodiments, the assembly 10 of FIG. 1 may be considered to comprise first and second active regions (e.g. active regions 29 and 30) within a semiconductor substrate 14 and separated from one another. A first conductive line (e.g., WL5) is buried in the semiconductor substrate and extends in a first direction (i.e., the direction of axis 5). The first conductive line WL5 divides the first active region 29 into first and second source/drain regions 42 and 40, and also divides the second active region 30 into third and fourth source/drain regions 42 and 40. A second conductive line (e.g., BL2) extends in a second direction (i.e., the direction of axis 7) and has an electrical contact to the first source/drain region 42 of the first active region 29. A third conductive line (e.g., BL3) extends in the second direction (i.e., the direction of axis 7) and has an electrical contact to the third source/drain region 42 of the second active region 30. A capacitor 46 includes a first electrode 55 electrically coupled to the second source/drain region 40 of the first active region 29, and includes a second electrode electrically 57 coupled to the fourth source/drain region 40 of the second active region 30. A dielectric material (film) 58 is between the first and second electrodes 55 and 57. An insulating layer 63 is over the semiconductor substrate 14 and has a pair of holes 67a and 67b extending therein (shown in FIG. 3), with the first and second holes 67a and 67b being vertically aligned with the second and fourth source/drain regions, respectively. The first hole 67a is filled with respective parts of the first electrode 55, the dielectric film 58 and the second electrode 57. The second hole 67b is also filled with respective parts of the first electrode 55, the dielectric film 58 and the second electrode 57. However, a region of the second electrode 57 in the second hole 67b is vertically elongated as compared to a region of the second electrode 57 within the first hole 67a. The first electrode 55 and the dielectric film 58 extend from the first hole 67a, over the insulating layer, and into the second hole 67b; where they intervene between the second electrode 57 and a side surface 61 of the second hole 67b (shown in FIG. 3). The conductive contacts 62 and 64 of FIG. 3 may be considered to comprise first and second conductive materials, 73a and 73b, respectively. The first conductive material 73a is between first electrode 55 and the second source/drain region 40 of the first active region 29; and the second conductive material 73b is between second electrode 57 and the fourth source/drain region 40 of the second active region 30. The first conductive material 73a couples the first electrode 55 to the second source/drain region 40 of the first active region 29; and the second conductive material 73b couples the second electrode 57 to the fourth source/drain region 40 of the second active region 30.

Figure 6:
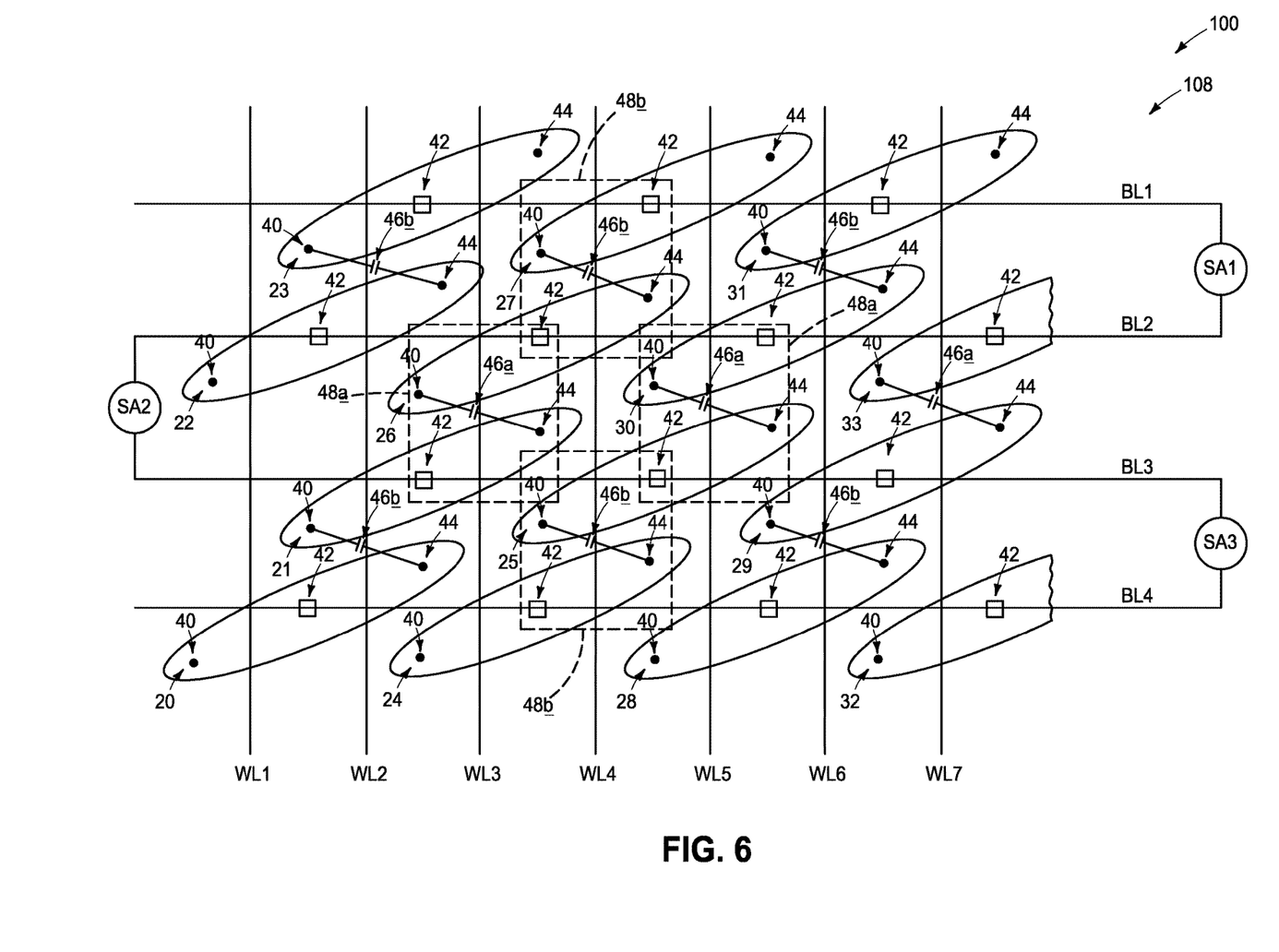
FIG. 6 is a diagrammatic top view of a region of a memory array showing another example configuration for memory cells having 2 transistors and 1 capacitor.

FIG. 6 diagrammatically illustrates regions of an assembly 100 comprising a memory array 108 in accordance with a second embodiment. A plurality of wordlines (WL1, WL2, WL3, WL4, WL5, WL6, WL7) extend across the memory array 108, and a plurality of bitlines (BL1, BL2, BL3, BL4) also extend across the memory array 108.

The same numbering will be used to describe the embodiment of FIG. 6 as is used above in describing embodiment of FIGS. 2-5, where appropriate.

Active regions 20-33 are shown proximate the wordlines (WL1, WL2, WL3, WL4, WL5, WL6, WL7). Each of the active regions 20-33 has the first capacitor-contact region 40, the second capacitor-contact region 44, and the bitline-contact region 42 between the first and second capacitor-contact regions 40 and 44. The bitline-contact regions 42 are shown as squares in FIG. 6 and the capacitor-contact regions 40/44 are shown as circles (dots) to assist the reader in distinguishing the capacitor-contact regions 40/44 from the bitline-contact regions 42. Such utilization of different symbols for the capacitor-contact regions 40/44 and bitline-contact regions 42 is not intended to indicate any specific actual physical difference in composition or geometry between the capacitor-contact regions 40/44 and the bitline-contact regions 42. The capacitor-contact regions 40/44 and bitline-contact regions 42 may have any suitable compositions and geometries; and may be the same as one another in some embodiments, and different from one another in other embodiments.

Capacitors 46 extend over the active regions 20-33. Each capacitor has its first electrode coupled to a different active region than its second electrode; with the capacitors extending between capacitor-contact regions (40, 44) of adjacent active regions. Some of the capacitors are identified as capacitors 46a of a first capacitor set, and others are identified as capacitors 46b of a second capacitor set. The labels 46a and 46b are utilized simply to distinguish capacitors of the first capacitor set from capacitors of the second capacitor set. In the shown embodiment, the capacitors 46a extend across odd-numbered wordlines (i.e., WL1, WL3, WL5, WL7), and the capacitors 46b extend across even-numbered wordlines (i.e., WL2, WL4, WL6).

Each of the capacitors 46 is comprised by a memory cell 48 (only some of which are labeled), with the memory cells being in one-to-one correspondence with the capacitors. The memory cells which include capacitors 46a of the first capacitor set are labeled as 48a and may be considered to be memory cells of the first memory cell set; and the memory cells which include capacitors 46b of the second capacitor set are labeled as 48b and may be considered to be memory cells of the second memory cell set. The memory cells of the first and second memory cell sets are identical to one another, and the labels 48a and 48b are utilized simply to distinguish memory cells of the first memory cell set from memory cells of the second memory cell set.

The bitlines (BL1, BL2, BL3, BL4) may be considered to be in paired arrangements; with one of the bitlines within each pair corresponding to a first comparative bitline, and the other of the bitlines within each pair corresponding to a second comparative bitline. The bitline pairs extend to sense amplifiers (SA1, SA2, SA3), which compare electrical properties of the first and second comparative bitlines to one another. Each of the memory cells 48 is uniquely addressed utilizing one of the wordlines (WL1, WL2, WL3, WL4, WL5, WL6, WL7), and one of the bitline pairs (i.e., each memory cell is coupled with a wordline and a bitline pair). The memory cells 48a are addressed utilizing paired bitlines BL2/BL3, and the sense amplifier SA2. In contrast, the memory cells 48b are addressed utilizing either the paired bitlines BL1/BL2 with a sense amplifier SA1, or the paired bitlines BL3/BL4 with sense amplifier SA3. Notably, the memory cells 48a of the first memory cell set are addressed utilizing the same bitlines as are utilized for addressing the memory cells 48b of the second memory cell set. However, the bitlines are utilized in different pairing arrangements for addressing memory cells 48a of the first memory cell set than for addressing memory cells 48b of the second memory cell set.

In the shown embodiment, the sense amplifiers utilized for addressing memory cells 48a of the first memory cell set (e.g., SA2) are on an opposite side of the memory array 8 than the sense amplifiers utilized for addressing memory cells 48b of the second memory cell set (e.g., SA1, SA3). The sense amplifier SA2 may be considered to be representative of a first set of sense amplifiers utilized for addressing the memory cells 48a of the first memory cell set, and the sense amplifiers SA1 and SA3 may be considered to be representative of a second set of sense amplifiers utilized for addressing the memory cells 48b of the second memory cell set.

In the above-described embodiment of FIGS. 2-5, the capacitors 46 did not cross the wordlines. In contrast, the capacitors 46 cross the wordlines ((WL1, WL2, WL3, WL4, WL5, WL6, WL7) in the embodiment of FIG. 6.

Figure 7:
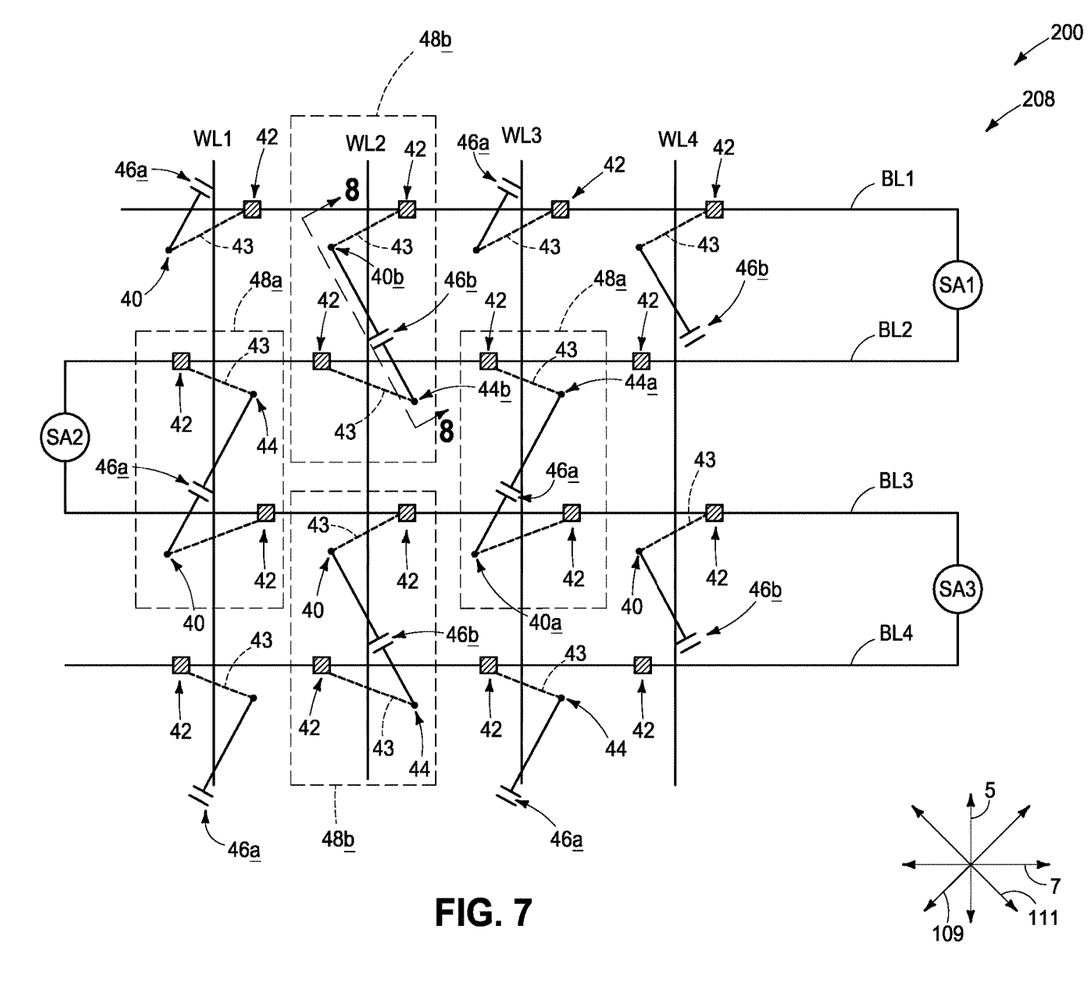
FIG. 7 is a diagrammatic top view of a region of a memory array showing another example configuration for memory cells having 2 transistors and 1 capacitor.
Figure 8:
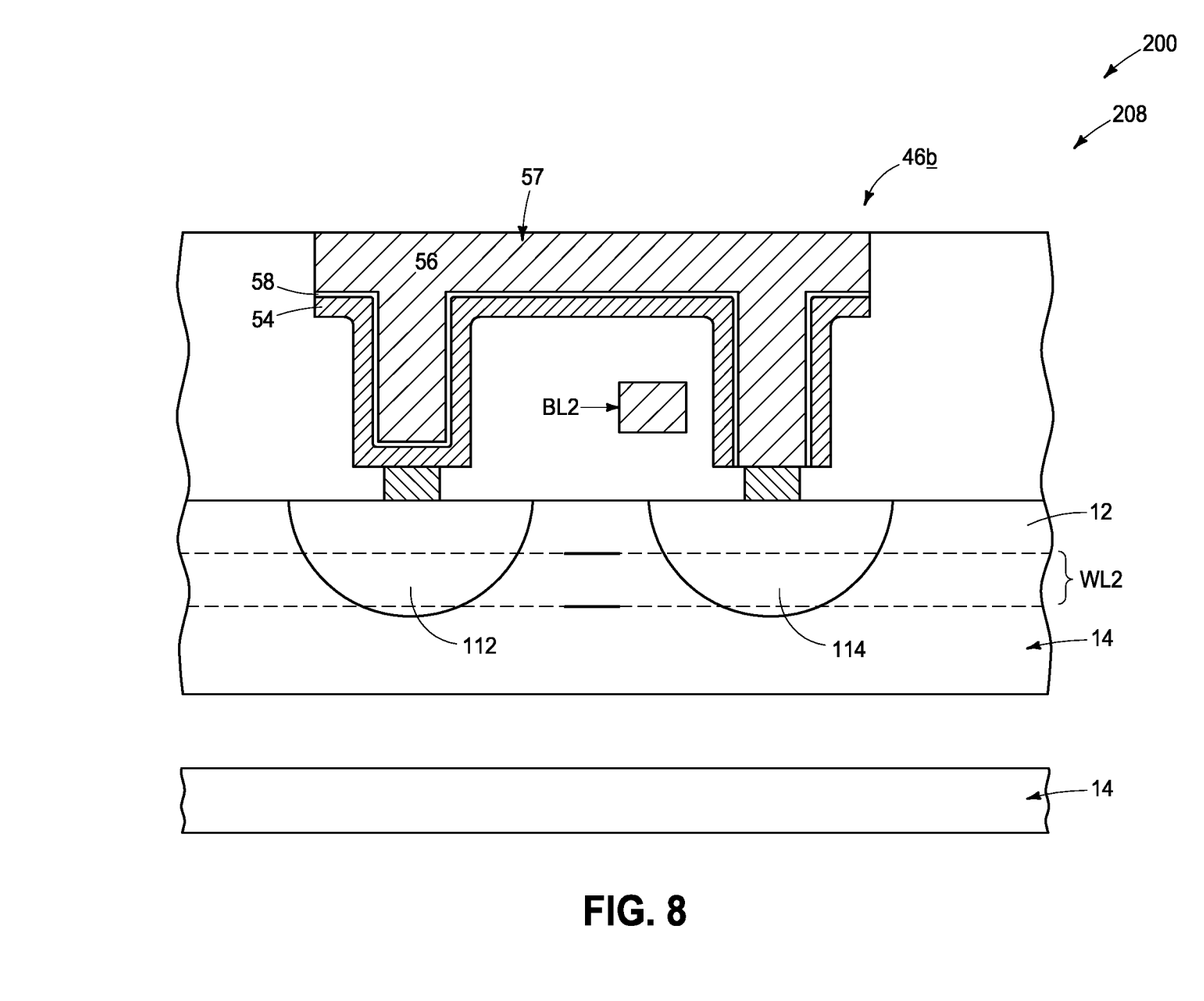
FIG. 8 is a diagrammatic cross-sectional side view of a region of the memory array of FIG. 7; with the cross-section of FIG. 8 being along the line 8-8 of FIG. 7.

FIGS. 7 and 8 diagrammatically illustrate regions of an assembly 200 comprising a memory array 208 in accordance with a third embodiment. Referring to FIG. 7, a plurality of wordlines (WL1, WL2, WL3, WL4) extend across the memory array 208, and a plurality of bitlines (BL1, BL2, BL3, BL4) also extend across the memory array 208.

The same numbering will be used to describe the embodiment of FIGS. 7 and 8 as is used above in describing embodiment of FIGS. 2-5, where appropriate.

The memory array 208 comprises a plurality of memory cells 48, with each of the memory cells comprising a capacitor 46. The capacitors are subdivided amongst capacitors 46a of a first capacitor set, and capacitors 46b of a second capacitor set. Similarly, the memory cells are subdivided amongst memory cells 48a of a first memory cell set comprising the capacitors 46a of the first capacitor set, and memory cells 48b of a second memory cell set comprising the capacitors 46b of the second capacitor set.

In the above-described embodiment of FIGS. 2-5, the capacitors 46 did not cross the wordlines (rather, the capacitors extend along a same direction of axis 5 as the wordlines). In contrast, in the embodiment of FIGS. 7 and 8, the capacitors 46 cross the wordlines (WL1, WL2, WL3, WL4). Specifically, the capacitors 46a extend along a direction of a first axis 109 which crosses the direction of the axis 5 of the wordlines; and the capacitors 46b extend along a direction of a second axis 111 which also crosses the axis 5 of the wordlines. The first and second axes 109 and 111 extend along different directions relative to one another, and cross one another Active areas analogous to the active areas 20-31 described above with reference to FIGS. 2-5 (not shown in FIG. 7) may be provided within the assembly 200 of FIG. 7. The capacitors 46 extend to capacitor-contact regions associated with such active areas, and the bitlines (BL1, BL2, BL3, BL4) extend to bitline-contact regions associated with such active areas. However, in the embodiment of FIG. 7, redistribution lines may be utilized to provide desired electrical connection from the capacitor electrodes (e.g., the electrodes 55 and 57 of a capacitor 46b described below with reference to FIG. 8) to the capacitor-contact regions; and/or may be utilized to provide desired electrical connection from the bitlines (BL1, BL2, BL3, BL4) to the bitline-contact regions.

The capacitor-contact regions are diagrammatically illustrated in FIG. 7 as regions 40 and 44, with capacitor-contact regions 40 being on opposing sides of the wordlines relative to capacitor-contact regions 44. Specifically, capacitor-contact regions 40 are on the left sides of the wordlines relative to the view of FIG. 7, and capacitor-contact regions 44 are on the right sides of the wordlines.

The bitline-contact regions are diagrammatically illustrated in FIG. 7 as boxes 42 coupled with the bitlines (BL1, BL2, BL3, BL4). The bitline-contact regions 42 are gatedly connected to the capacitor-contact regions 40/44 through transistor gates along the wordlines (WL1, WL2, WL3, WL4). The gated connections between bitline-contact regions 42 and capacitor-contact regions 40/44 are diagrammatically illustrated with dashed-lines 43 (only some of which are labeled).

In the shown embodiment, one of the capacitor-contact regions 40 on the left side of the wordline WL3 is labeled as a region 40a, and may be referred to as a first capacitor-contact region on a first side of a first wordline corresponding to WL3. A capacitor-contact region 44 on the right side of the wordline WL3 is labeled as a region 44a, and may be referred to as a second capacitor-contact region on a second side of the first wordline WL3; with the second side of the wordline WL3 being in opposing relation to the first side of the wordline WL3. A capacitor-contact region 40 on the left side of the wordline WL2 is labeled as a region 40b, and may be referred to as a third capacitor-contact region on a first side of a second wordline corresponding to the wordline WL2. A capacitor-contact region 44 on the right side of the wordline WL2 is labeled as a region 44b, and may be referred to as a fourth capacitor-contact region on a second side of the second wordline WL2; with the second side of the wordline WL2 being in opposing relation to the first side of the wordline WL2.

One of the capacitors 46a of the first capacitor set is shown to have its first electrode electrically coupled with the first capacitor-contact region 40a, and its second electrode electrically coupled with the second capacitor-contact region 44a; and such capacitor 46a extends across the first wordline WL3. One of the second capacitors 46b of the second capacitor set is shown to have its first electrode electrically coupled with the third capacitor-contact region 40b, and to have its second electrode electrically coupled with the fourth capacitor-contact region 44b; and such capacitor 46b extends across the second wordline WL2.

The bitlines (BL1, BL2, BL3, BL4) may be considered to be in paired arrangements analogous to the paired arrangements described above with reference to FIG. 2. One of the bitlines within each pair corresponds to a first comparative bitline, and the other of the bitlines within each pair corresponds to a second comparative bitline. The bitline pairs extend to sense amplifiers (SA1, SA2, SA3), which compare electrical properties of the first and second comparative bitlines to one another. Each of the memory cells 48 is uniquely addressed utilizing one of the wordlines (WL1, WL2, WL3, WL4), and one of the bitline pairs. The memory cells 48a are addressed utilizing paired bitlines BL2/BL3, and the sense amplifier SA2. In contrast, the memory cells 48b are addressed utilizing either the paired bitlines BL1/BL2 with a sense amplifier SA1, or the paired bitlines BL3/BL4 with sense amplifier SA3. Notably, the memory cells 48a of the first memory cell set are addressed utilizing the same bitlines as are utilized for addressing the memory cells 48b of the second memory cell set, but the bitlines are utilized in different pairing arrangements for addressing memory cells 48a of the first memory cell set than for addressing memory cells 48b of the second memory cell set.

In the shown embodiment, the sense amplifiers utilized for addressing memory cells 48a of the first memory cell set (e.g., SA2) are on an opposite side of the memory array 108 than the sense amplifiers utilized for addressing memory cells 48b of the second memory cell set (e.g., SA1, SA3). The sense amplifier SA2 may be considered to be representative of a first set of sense amplifiers utilized for addressing the memory cells 48a of the first memory cell set, and the sense amplifiers SA1 and SA3 may be considered to be representative of a second set of sense amplifiers utilized for addressing the memory cells 48b of the second memory cell set.

The capacitors 46, wordlines (WL1, WL2, WL3, WL4) and bitlines (BL1, BL2, BL3, BL4) of FIG. 7 may have any suitable configuration and structural relation relative to one another. FIG. 8 is a cross-sectional view through a portion of the example memory array 208 of FIG. 7 showing example structural relationships of some example structures.

Referring to FIG. 8, an example capacitor 46b is shown to comprise the conductive first material 54 configured as the first electrode 55, the conductive second material 56 configured as the second electrode 57, and the dielectric material 58 between the first and second conductive materials 54 and 56.

Example active regions 112 and 114 are shown comprising conductively-doped regions extending into a semiconductor material 12.

The wordline WL2 is diagrammatically illustrated in the cross-section of FIG. 8, and portions are shown in dashed-line view to indicate that such portions are in front of or behind the plane of the cross-section of FIG. 8. Specifically, the left side of the wordline WL2 is behind the plane of the cross-section of FIG. 8, the middle of the wordline WL2 passes through the plane of the cross-section of FIG. 8, and the right side of the wordline WL2 is in front of the plane of the cross-section of FIG. 8.

The capacitor 46b of FIG. 8 is similar to the capacitor 46a of FIG. 3.

The structures and architectures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials outside of the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include an apparatus having memory cells. Bitline pairs couple with each of the memory cells. One of the bitlines within each bitline pair corresponds to a first comparative bitline and the other of the bitlines within each bitline pair corresponds to a second comparative bitline. The bitline pairs extend to sense amplifiers which compare electrical properties of the first and second comparative bitlines to one another. The memory cells are subdivided amongst a first memory cell set using a first set of bitline pairs, and a second memory cell set using a second set of bitline pairs. The second set of bitline pairs has the same bitlines as the first set of bitline pairs, but in a different pairing arrangement as compared to the first set of bitline pairs.

Some embodiments include an apparatus having wordlines supported by a base. Capacitors are proximate the wordlines and are included by memory cells of a memory array. The capacitors are subdivided amongst a first capacitor set and a second capacitor set. The memory cells are subdivided amongst a first memory cell set and a second memory cell set. The memory cells of the first memory cell set contain the capacitors of the first capacitor set, and the memory cells of the second memory cell set contain the capacitors of the second capacitor set. Bitline pairs couple with each of the memory cells. One of the bitlines within each bitline pair corresponds to a first comparative bitline and the other of the bitlines within each bitline pair corresponds to a second comparative bitline. The bitline pairs extend to sense amplifiers which compare electrical properties of the first and second comparative bitlines to one another. The memory cells of the first memory cell set using a first set of bitline pairs and a first set of sense amplifiers. The memory cells of the second memory cell set using a second set of bitline pairs and a second set of sense amplifiers. The second set of bitline pairs has the same bitlines as the first set of bitline pairs, but in a different pairing arrangement as compared to the first set of bitline pairs.

Some embodiments include an apparatus comprising a pair of parallel wordlines extending across a semiconductor base. The parallel wordlines are a first wordline and a second wordline. Active regions are proximate the wordlines. Each active region includes a bitline-contact region between the first and second wordlines, a first capacitor-contact region on an opposing side of the first wordline from the bitline-contact region, and a second capacitor-contact region on an opposing side of the second wordline from the bitline-contact region. Capacitors extend over the active regions. Individual capacitors have a first conductive electrode, a second conductive electrode, and a dielectric material between the first and second conductive electrodes. The capacitors are subdivided amongst a first capacitor set and a second capacitor set. Each capacitor within the first capacitor set has its first and second electrodes electrically coupled with first capacitor-contact regions of adjacent active regions, with the first electrodes being coupled with different active regions than the second electrodes. Each capacitor within the second capacitor set has its first and second electrodes electrically coupled with second capacitor-contact regions of adjacent active regions, with the first electrodes being coupled with different active regions than the second electrodes.

Some embodiments include an apparatus comprising a pair of wordlines extending across a semiconductor base. The wordlines are a first wordline and a second wordline. First capacitor-contact regions are on a first side of the first wordline, and second capacitor-contact regions are on second side of the first wordline in opposing relation to the first side of the first wordline. Third capacitor-contact regions are on a first side of the second wordline, and fourth capacitor-contact regions are on second side of the second wordline in opposing relation to the first side of the second wordline. Capacitors extend across the first and second wordlines. Individual capacitors have a first conductive electrode, a second conductive electrode, and a dielectric material between the first and second conductive electrodes. The capacitors are subdivided amongst a first capacitor set and a second capacitor set. The capacitors within the first capacitor set extend across the first wordline and extend in a first direction. The capacitors within the second capacitor set extend across the second wordline and extend in a second direction different from the first direction. Each capacitor within the first capacitor set has its first electrode electrically coupled with a first capacitor-contact region, and has its second electrode electrically coupled with a second capacitor-contact region. Each capacitor within the second capacitor set has its first electrode electrically coupled with a third capacitor-contact region, and has its second electrode electrically coupled with a fourth capacitor-contact region.

Some embodiments include an apparatus comprising a semiconductor substrate. First and second active regions are within the semiconductor substrate and are separated from one another. A first conductive line is buried in the semiconductor substrate and extends in a first direction to divide the first active region into first and second source/drain regions, and to divide the second active region into third and fourth source/drain regions. A second conductive line extends in a second direction and has an electrical contact with the first source/drain region of the first active region. The second direction crosses the first direction. A third conductive line extends in the second direction and has an electrical contact with the third source/drain region of the second active region. A capacitor includes a first electrode, a second electrode and a dielectric film between the first electrode and the second electrode. The first electrode is electrically coupled to the second source/drain region of the first active region, and the second electrode is electrically coupled to the fourth source/drain region of the second active region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An apparatus, comprising:
   memory cells;
   bitlines arranged as bitline pairs, the bitline pairs coupled with each of the memory cells; one of the bitlines within each bitline pair corresponding to a first comparative bitline and the other of the bitlines within each bitline pair corresponding to a second comparative bitline; the first and second comparative bitlines of each bitline pair extending to the same sense amplifier which compares electrical properties of the first and second comparative bitlines to one another;
   the memory cells being subdivided amongst a first memory cell set using a first set of bitline pairs, and a second memory cell set using a second set of bitline pairs; and
   the second set of bitline pairs having the same bitlines as the first set of bitline pairs, but in a different pairing arrangement as compared to the first set of bitline pairs.

2. The apparatus of claim 1 wherein the memory cells include capacitors, and comprising wordlines gatedly coupling the capacitors with the bitlines; wherein the wordlines are recessed into a semiconductor material of a semiconductor substrate.

3. The apparatus of claim 2 wherein the bitlines are over the wordlines.

4. The apparatus of claim 3 wherein the bitlines are under uppermost regions of the capacitors.

5. The apparatus of claim 3 wherein the bitlines are over uppermost regions of the capacitors.

6. The apparatus of claim 2 wherein the capacitors do not cross over the wordlines.

7. The apparatus of claim 2 wherein the capacitors cross over the wordlines.

8. The apparatus of claim 2 wherein each of the capacitors has a first region laterally adjacent a second region; the first region having a container-shaped portion of the first electrode, and having the dielectric material and the second electrode extending into said container-shaped portion of the first electrode; and the second region having an opening extending through the first electrode.

9. An apparatus comprising:
   a semiconductor substrate;

first and second active regions within the semiconductor substrate and separated from one another;
a first conductive line buried in the semiconductor substrate and extending in a first direction to divide the first active region into first and second source/drain regions, and to divide the second active region into third and fourth source/drain regions;
a second conductive line extending in a second direction and having an electrical contact with the first source/drain region of the first active region, the second direction crossing the first direction;
a third conductive line extending in the second direction and having an electrical contact with the third source/drain region of the second active region;
a capacitor including a first electrode, a second electrode and a dielectric film between the first electrode and the second electrode, the first electrode being electrically coupled to the second source/drain region of the first active region and the second electrode electrically coupled to the fourth source/drain region of the second active region; and
a sense amplifier coupled to the second conductive line and the same sense amplifier coupled to the third conductive line.

10. The apparatus of claim 9, further comprising an insulating layer over the semiconductor substrate, the insulating layer including first and second holes;
wherein the first hole is filled with parts of the first electrode, the dielectric film and the second electrode; and
wherein the second hole is filled with different parts of the first electrode, the dielectric film and the second electrode; a region of the second electrode within the second hole being vertically-elongated as a compared to a region of the second electrode within the first hole.

11. The apparatus of claim 10, wherein the first electrode and the dielectric film are elongated from the first hole over the insulating layer and reach the second hole to intervene between the second electrode and a side surface of the second hole.

12. The apparatus of claim 10, further comprising first conductive material and a second conductive material,
wherein the first conductive material intervenes between the second source/drain region of the first active region and a bottom portion of the first hole to couple the second source/drain region and the first electrode to each other; and
wherein the second conductive material intervenes between the fourth source/drain region of the second active region and a bottom portion of the second hole to couple the fourth source/drain region and the second electrode to each other.

13. The apparatus of claim 12, wherein the first hole is vertically aligned with the second source/drain region and the second hole is vertically aligned with the fourth source/drain region.

14. The apparatus of claim 9 wherein a top view of each of the first and second active regions comprise an island of conductively-doped semiconductor material configured as an elongated oval.

15. The apparatus of claim 1 wherein each memory cell comprises a capacitor and a first active region spaced from a second active region, the capacitor comprising a first electrode coupled to the first active region and a second electrode coupled to the second active region.

16. An apparatus comprising:
a semiconductor substrate;
first and second active regions within the semiconductor substrate and separated from one another;
a first conductive line buried in the semiconductor substrate and extending in a first direction to divide the first active region into first and second source/drain regions, and to divide the second active region into third and fourth source/drain regions;
a second conductive line extending in a second direction and having an electrical contact with the first source/drain region of the first active region, the second direction crossing the first direction;
a third conductive line extending in the second direction and having an electrical contact with the third source/drain region of the second active region;
a capacitor including a first electrode, a second electrode and a dielectric film between the first electrode and the second electrode, the first electrode being electrically coupled to the second source/drain region of the first active region and the second electrode electrically coupled to the fourth source/drain region of the second active region;
an insulating layer over the semiconductor substrate, the insulating layer including first and second holes;
wherein the first hole is filled with parts of the first electrode, the dielectric film and the second electrode; and
wherein the second hole is filled with different parts of the first electrode, the dielectric film and the second electrode; a region of the second electrode within the second hole being vertically-elongated as a compared to a region of the second electrode within the first hole.

17. The apparatus of claim 16, wherein the first electrode and the dielectric film are elongated from the first hole over the insulating layer and reach the second hole to intervene between the second electrode and a side surface of the second hole.

18. The apparatus of claim 16, further comprising first conductive material and a second conductive material,
wherein the first conductive material intervenes between the second source/drain region of the first active region and a bottom portion of the first hole to couple the second source/drain region and the first electrode to each other; and
wherein the second conductive material intervenes between the fourth source/drain region of the second active region and a bottom portion of the second hole to couple the fourth source/drain region and the second electrode to each other.

19. The apparatus of claim 18, wherein the first hole is vertically aligned with the second source/drain region and the second hole is vertically aligned with the fourth source/drain region.

* * * * *